US008996435B2

(12) United States Patent
Ivrii et al.

(10) Patent No.: US 8,996,435 B2
(45) Date of Patent: Mar. 31, 2015

(54) DETERMINING INVARIANTS IN A MODEL

(75) Inventors: Alexander Ivrii, Haifa (IL); Sharon Keidar-Barner, Megiddo (IL); Arie Matsliah, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 13/195,876

(22) Filed: Aug. 2, 2011

(65) Prior Publication Data
US 2013/0036079 A1    Feb. 7, 2013

(51) Int. Cl.
*G06N 5/02*    (2006.01)
*G06F 17/50*   (2006.01)
*G06F 17/11*   (2006.01)

(52) U.S. Cl.
CPC ............. *G06N 5/02* (2013.01); *G06F 17/5022* (2013.01); *G06F 17/11* (2013.01)
USPC .................................... 706/46; 703/2; 703/15

(58) Field of Classification Search
None
See application file for complete search history.

(56) References Cited

U.S. PATENT DOCUMENTS

| 6,038,392 | A * | 3/2000 | Ashar et al. ............. 703/27 |
| 6,415,430 | B1 * | 7/2002 | Ashar et al. ............. 716/105 |
| 7,047,139 | B2 * | 5/2006 | Shtrichman ............. 702/22 |
| 7,406,405 | B2 | 7/2008 | McMillan et al. |

OTHER PUBLICATIONS

Biere, Armin et al.; "Symbolic Model Checking without BDDs"; 1999; Springer Berlin Heidelberg; 19 pages.*
McMillan, K. L.; "Quantified Invariant Generation using an Interpolating Saturation Prover"; 2008; Springer Berlin Heidelberg; 19 pages.*
Gomes, Carla P. et al.; "Satisfiability Sovers"; 2008; Elsevier; pp. 89-134.*
Biere, Armin et al.; "Bounded Model Checking"; 2009; Armin Biere and IOS Press; Handbook of Satisfiability; pp. 457-481.*
Gianpiero Cabodi et al., "Speeding up model checking by exploiting explicit and hidden verification constraints", Date 2009: 1686-1691.
Gianpiero Cabodi et al., "Strengthening Model Checking Techniques With Inductive Invariants", IEEE Trans. on CAD of Integrated Circuits and Systems 28(1): 154-158 (2009).
Michael L. Case et al., "Automated Extraction of Inductive Invariants to Aid Model Checking", FMCAD 2007: 165-172.
Jason Baumgartner et al., "Scalable conditional equivalence checking: An automated invariant-generation based approach", FMCAD 2009: 120-127.
Aaron R. Bradley, "k-Step Relative Inductive Generalization", CoRR abs/1003.3649: (2010).
Aaron R. Bradley and Zohar Manna, "Property-directed incremental invariant generation", Formal Asp. Comput. 20(4-5): 379-405 (2008).

(Continued)

*Primary Examiner* — Stanley K Hill
(74) *Attorney, Agent, or Firm* — Ziv Glazberg

(57) ABSTRACT

A method, apparatus and product for determining invariants in a model. One exemplary embodiments is a computer-implemented method performed by a computerized device, comprising: obtaining a set of candidates of invariants with respect to a model, the model comprising a transition relation axiom and an initial axiom; for substantially each candidate, adding to the model a first auxiliary variable, the first auxiliary variable is defined to be implied from the candidate being held in a predetermined cycle; iteratively trying to prove an inductive step with respect to a subset of the candidates, wherein in response to determining that a candidate is not held inductively removing the candidate from the subset of the candidates, wherein determining which candidate is not held inductively is performed based on values of the first auxiliary variables.

21 Claims, 3 Drawing Sheets

(56) References Cited

OTHER PUBLICATIONS

Oded Fuhrmann and Shlomo Hoory, "On Extending Bounded Proofs to Inductive Proofs", CAV 2009: 278-290.

Niklas Eén and Niklas Sörensson, "Temporal induction by incremental SAT solving", Electr. Notes Theor. Comput. Sci. 89(4): (2003).

Niklas Eén et al., "A Single-Instance Incremental SAT Formulation of Proof- and Counterexample-Based Abstraction", CoRR abs/1008.2021: (2010).

Thalmaier Max et al., "Analyzing K-step Induction to Compute Invariants for SAT-based Property Checking", 2010 47th ACM/EDAC/IEEE Design Automation Conference (DAC 2010), 176-81, 2010.

He, N. et al., "Using Symbolic Simulation and Weakening Abstraction for Formal Verification of Embedded Software", Proceedings of the 10th IASTED International Conference on Software Engineering and Applications, 334-9, 2006.

\* cited by examiner

DETERMINING INVARIANTS IN A MODEL

TECHNICAL FIELD

The present disclosure relates to model checking in general, and to identification of invariant candidates that may be used for model checking, in particular.

BACKGROUND

State of the art computerized components are very complex and require extensive quality assurance checks. One of the commonly used techniques is formal verification in which the computerized component is modeled and is examined by a model checker. The model describes all possible behaviors of the computerized component based on inputs from the environment and calculations performed by the computerized component itself. Most components are represented by cycled models in which the state of the component may differ from one cycle to the other. It will be noted that the computerized component may be a software component, firmware component, hardware component or the like. It will be further noted that in some cases the component to be verified may be a business method, user interaction, communication protocol or any other form of activity or computation that may be expressed formally using a model.

A model checker checks that the model holds a predetermined specification property. An exemplary specification property may be that a triggered event is always handled by the component or that a certain variable is never assigned a predetermined value. The specification property may be attributed to one or more cycles. For simplicity, the current disclosure discusses mainly a specification property that is associated to a cycle. However, it should be understood that the disclosed subject matter is not limited to such a specification property. For example, the specification property may be associated with more than one cycle, such as for example, after a flag is raised in a cycle, an alert is issued within a predetermined number of cycles. In some exemplary embodiments, the property is what is known in the art as safety property, and may be provided using a Property Specification Language (PSL) formula such as AGp, indicating that Always (i.e., in each cycle), Globally (i.e. in each possible scenario), property p holds. Property p may be a property provided in temporal logic.

One form of model checking utilizes a Bounded Model Checker (BMC). The bounded model checker determines whether the specification property holds for a predetermined number of cycles. A bounded model is a model which has a bounded number of cycles. A bounded model associated with an unbounded model may be determined by truncating behaviors of the model in every cycle that exceeds a predetermined bound. While the BMC may falsify the specification property by determining that in a given one or more cycles the specification property is not held, it cannot prove that the specification is held for the model, as the number of cycles is bounded. The BMC can only provide a proof that the specification is held for every cycle within the predetermined number of cycles.

One family of BMC engines utilizes a Boolean satisfiability problem solver, also known as SAT solver, for solving a Boolean satisfiability problem that is associated with the predetermined number of cycles. The Boolean satisfiability problem is formulated in a Conjunctive Normal Form (CNF) formula. A CNF formula of the form $I \wedge TR^K_{may}$ describe a behavior of the bounded model within k steps. I is the initial state, TR is a transition relation from state i to state i+1, k transition relations are utilized to model behavior until cycle k. In some cases, in order to verify the property p, the CNF may correspond to a formula $I \wedge TR^K \wedge \neg p$. In case a satisfying assignment of the CNF is found, the property p is falsified. Otherwise, that SAT solver may prove that there are no satisfying assignments to the CNF. Optionally, the SAT solver may provide a proof of unsatisfiability.

BRIEF SUMMARY

One exemplary embodiment of the disclosed subject matter is a computer-implemented method performed by a computerized device, comprising: obtaining a set of candidates of invariants with respect to a model, the model comprising a transition relation axiom and an initial axiom; for substantially each candidate, adding to the model a first auxiliary variable, the first auxiliary variable is defined to be implied from the candidate being held in a predetermined cycle; iteratively trying to prove an inductive step with respect to a subset of the candidates, wherein in response to determining that a candidate is not held inductively removing the candidate from the subset of the candidates, wherein determining which candidate is not held inductively is performed based on values of the first auxiliary variables.

Another exemplary embodiment of the disclosed subject matter is an apparatus of a processing unit, the apparatus comprising: a candidates obtainer operative to obtain a set of candidates of invariants with respect to a model, the model comprising a transition relation axiom and an initial axiom; a first auxiliary definer operative, with respect to substantially each candidate, to add to the model a first auxiliary variable, the first auxiliary variable is defined to be implied from the candidate being held in a predetermined cycle; an inductive step proof module operative to prove inductively that if a subset of the candidates is held in a first cycle the subset is held in the predetermined cycle, wherein the first cycle precedes the predetermined cycle, wherein the inductive step proof module is operative to determine whether the candidates of the subset are held in the predetermined cycle using values of the first auxiliary variables.

Yet another exemplary embodiment of the disclosed subject matter is a computer program product comprising: a non-transitory computer readable medium; a first program instruction for obtaining a set of candidates of invariants with respect to a model, the model comprising a transition relation axiom and an initial axiom; a second program instruction for adding to the model a first auxiliary variable for substantially each candidate, the first auxiliary variable is defined to be implied from the candidate being held in a predetermined cycle; a third program instruction for iteratively trying to prove an inductive step with respect to a subset of the candidates, wherein in response to determining that a candidate is not held inductively removing the candidate from the subset of the candidates, wherein determining which candidate is not held inductively is performed based on values of the first auxiliary variables; and wherein the first, second, and third program instructions are stored on the non-transitory computer readable medium.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
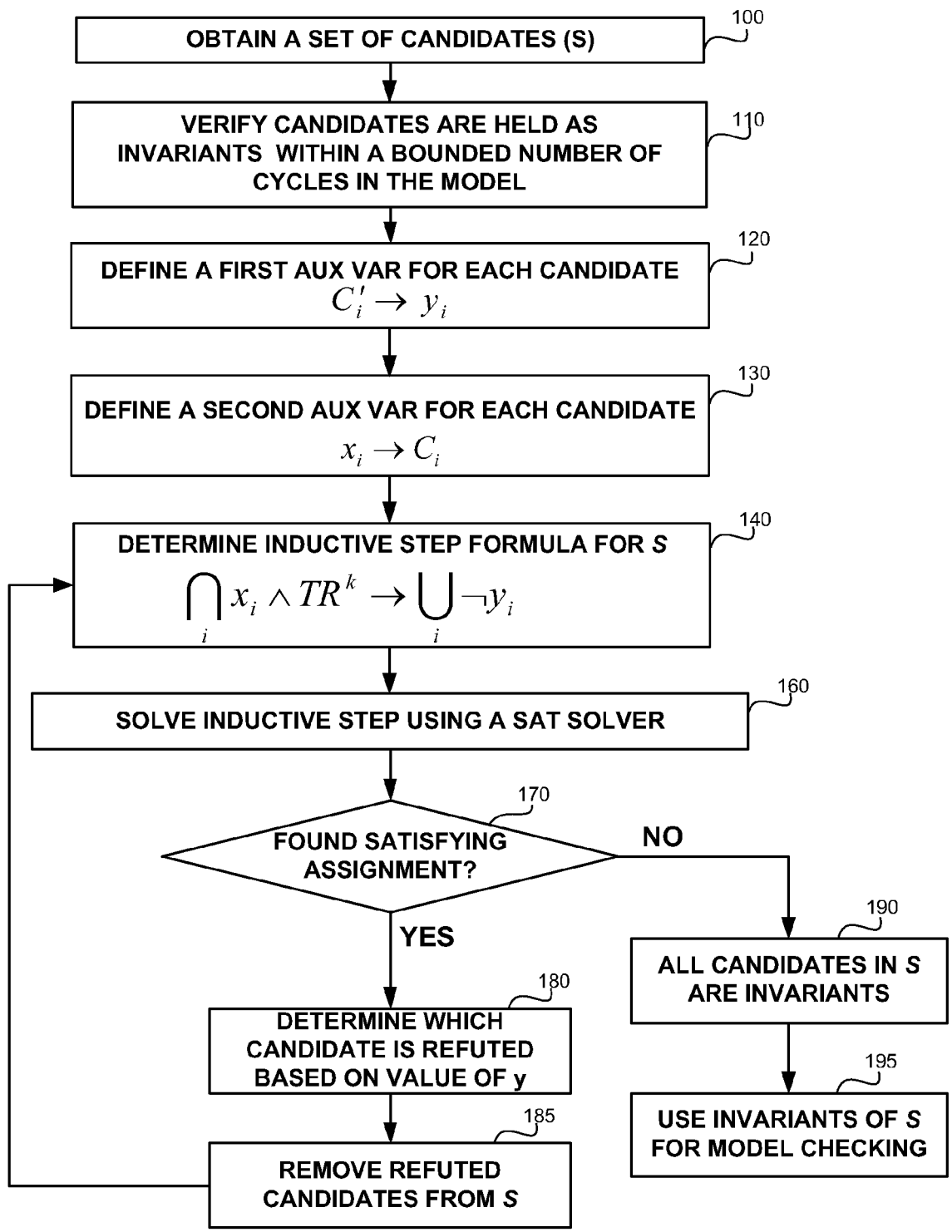
FIG. 1 shows a flowchart diagram of steps in a method for identifying invariant candidates, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that blocks of the flowchart illustrations and/or block diagrams, and combinations of blocks in the flowchart illustrations and/or block diagrams, can be implemented by computer program instructions. These computer program instructions may be provided to one or more processors of a general purpose computer, special purpose computer, a tested processor, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable medium that can direct a computer or other programmable data processing apparatus to function in a particular manner, such that the instructions stored in the non-transient computer-readable medium produce an article of manufacture including instruction means which implement the function/act specified in the flowchart and/or block diagram block or blocks.

The computer program instructions may also be loaded onto a device. A computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to determine one or more invariants of a model. An invariant is a property, such as a temporal property, whose value remains unchanged during every state of the model. For example, in a model in which there is a variable v whose value is flipped each cycle, the property v≠next(v), is an invariant. In some exemplary embodiments, there may be invariants that are held for each cycle after a predetermined number of cycles (e.g., not held until cycle 4 and are held from cycle 4 and onwards).

An invariant may be useful in proving that a property is held. In some exemplary embodiments, a model checker may gain a significant performance speedup when proving the property and utilizing one or more invariants. In some exemplary embodiments, proving the property may become feasible due to the utilization of the invariants. Thus, invariants may be useful to overcome state-space explosion problem in some cases.

It will be noted that an invariant may be useful in model checking for non-safety properties as well, such as for example, a liveness property.

Another technical problem is to efficiently determine a subset of invariants from a set of candidate invariants. In some exemplary embodiments, there may exist a substantial number of candidate invariants to be checked. It is desired to determine a subset in a relatively efficient manner.

Yet another technical problem is to be able to determine in a relatively efficient manner whether or not a certain candidate is refuted.

One technical solution is to try and prove in an inductive manner that a subset of candidates is an invariant. The subset may be checked to verify that it implies itself in a succeeding cycle. In some exemplary embodiments, a formula such as:

$$\bigcap_i C_i \wedge TR^k \to \bigcup_i \neg C'_i$$

may be utilized. where each $C_i$ is an invariant candidate, $TR^k$ is a transition relation of the model useful for modeling operation within k cycles, and the $C'_i$s are the invariant candidates shifted by one cycle. Thus, a satisfying assignment to the formula is indicative of a valid transition from a state in which the candidates are held to a state in which at least one candidate is refuted. If the candidates are invariants then there is no satisfying assignment to the formula.

If one or more candidates are not held in the shifted form ($C'_i$), they may be removed from the list of candidates, and the same formula may be reused with respect to a subset of the original set of candidates. The disclosed subject matter may iteratively remove candidates from the subset until all candidates remaining are invariants and are proven, or until no candidates remain.

As is known in the art, a state of the model may be represented using a set of variables and for a bounded number of cycles a CNF may be used. The CNF is a conjunction of clauses, wherein each clause is a disjunction of literals. A literal is either a true or a false value of a variable. The variables are used to describe the state of the model at each cycle. Assuming that variables x,y,z describe a state of the model, then in a bounded model of k cycles, there will be at 3 times k variables (e.g., $x_1, y_1, z_1, x_2, y_2, z_2, \ldots, x_k, y_k, z_k$) to describe the bounded model. The transition relation axiom is used to define a next state based on a current state (and optionally, based on input signals).

In some exemplary embodiments, a first auxiliary variable ($y_i$) may be defined with respect to each candidate, such that the following relationship is held: $C'_i \to y_i$. As the candidate may be defined based on several variables (e.g., $(a \wedge b \to \neg c)$), utilizing the first auxiliary variable may be useful to determine whether or not the candidate is held. In some exemplary embodiments, a single Boolean variable is useful for fast determination of whether the candidate is held or not. Thus, the formula being used may be of the form:

$$\bigcap_i C_i \wedge TR^k \to \bigcup_i \neg y_i.$$

It is guaranteed, that if all candidates are held, all first auxiliary variables are held as well, and thus no satisfying assumption is found.

It will be noted that as the relationship between a candidate and its corresponding first auxiliary variable is an implication, the fact that the first auxiliary variable is true does not guarantee that the candidate is held. In other words, if the candidate is not held, the value of the first auxiliary variable may still be true. As will be appreciated by a person of ordinary skill in the art, the implication relationship is sufficient for the disclosed subject matter and may provide a relatively efficient solution.

Furthermore, as the relationship is an implication and not iff relationship ($\leftrightarrow$), the added logic to the formula may be relatively relaxed. However, in some exemplary embodiments, an iff relationship may be utilized.

In some exemplary embodiments, a second auxiliary variable ($x_i$) may be defined with respect to each candidate, such that the following relationship is held: $x_i \rightarrow C_i$. The second auxiliary variable may be utilized to efficiently determine which candidates are checked. Thus, the formula being used may be of the form:

$$\bigcap_i x_i \wedge TR^k \rightarrow \bigcup_i \neg y_i.$$

When using an incremental SAT solver deduction of previous executions may be used, and thus the formula may be solved (e.g., determining a satisfying assignment or determining that no such assignment exists) in a more efficient manner In some exemplary embodiments, the SAT solver may support assumptions, and the assumptions may be based on the second auxiliary variables. In some exemplary embodiments, assumptions may be further based on the first auxiliary variables. In some exemplary embodiments, the deductions based on the transition relation may be saved and reused, while deductions which depend on whether a specific candidate is held may not be saved.

In some exemplary embodiments, unit clause assumptions may be of the form ($x_i$). Furthermore, an additional assumption may be $$\left(\bigcup_i \neg y_i\right).$$

If only unit clauses are allowed, a third auxiliary variable z may be defined using the following clause in a CNF:

$$\left(z \vee \bigcup_i \neg y_i\right)$$

(either z is true or at least one of the second auxiliary variables is false). A unit clause assumption negating z (i.e., ($\neg z$)) may be utilized to induce the additional assumption.

Another technical solution is to verify that the candidates are held within a bounded number of cycles by the model. As the inductive step may indicate that the candidate remains held after it is held once, a base determination showing that the candidate is at some point held may be required.

Yet another technical solution is to utilize the proven invariants for performing model checking. In some exemplary embodiments, a safety property may be determined to hold within a bounded number of cycles, and may be added as a candidate invariant. Determining that the property is an invariant may be used as a determination that the property holds on the model.

One technical effect of utilizing the disclosed subject matter is a relatively efficient manner of determining invariants.

Another technical effect of utilizing the disclosed subject matter is potentially gaining a speedup in model checking, by introducing the invariants of the model. Additionally or alternatively, proving a property that could not have been proven with a predetermined set of resources (e.g., memory space, processing capabilities, time), may be feasible due to the determined invariants.

Yet another technical effect of utilizing the disclosed subject matter is to enable usage of incremental feature of a SAT solver, thereby enabling a faster determinations by the SAT solver in an iterative process.

Yet another technical effect of utilizing the disclosed subject matter is to utilize implication relationship between auxiliary variables and variables of the model, thereby adding a relatively relaxed constraint to the model.

Yet another technical effect of utilizing the disclosed subject matter is to efficiently deal with candidates which cannot be represented using a single unit clause or by a single non-unit clause. For example, the candidate ($a \wedge (b \vee c)$) cannot be represented using a single clause. It is represented, in a CNF, using two clauses, such as: (a) and ($b \vee c$).

Referring now to FIG. 1 showing a flowchart diagram of steps in a method for identifying invariant candidates, in accordance with some exemplary embodiments of the disclosed subject matter.

The disclosed subject matter relates to a model. The model may be a descriptive model of operation of a computerized device, such as a hardware or software component. In some exemplary embodiments, the model may describe operation of a communication protocol, business method or the like. In some exemplary embodiments, the model describe states in discrete cycles, such as for example, clocking cycles of a CPU, turns in a communication protocol, or the like. In some exemplary embodiments, the model may be unbounded, such that it may describe a state after any number of cycles.

In some exemplary embodiments, a state of the model may be defined using a set of variables. A transition relation may define a change from a cycle to a next cycle, based on the current state and the input. A set of one or more initial states may be provided defining potential initial states of the model. In some exemplary embodiments, the model may be depicted using a descriptive language such as SystemC, Hardware Description Language (HDL), Verilog, Property Specification Language (PSL) or the like.

In step 100, a set of invariant candidates may be obtained. The invariant candidates may be obtained from a user (not shown), or from an automated process. Concurrently to filing of the Present Application, Applicants are filing an additional application, titled "IDENTIFYING INVARIANT CANDIDATES BASED ON PROOFS", which is hereby incorporated by reference, disclosing a manner to obtain a set of candidates.

In step 110, a determination whether the candidates are held within a bounded model may be determined For example, if the candidates are held as invariants by the initial axiom (e.g., initial states of the model) or are held as invariants after a predetermined number of cycles from the initial states. In some exemplary embodiments, based on a determination that the candidate is held as an invariant at some cycle (e.g., init cycle or non-init cycle), an inductive determination may be determined in accordance with the disclosed subject matter that the candidate holds on all cycles thereafter.

In some exemplary embodiments, step 110 may be determined using a bounded model checking determination. A CNF formula of the bounded model may be determined and a SAT solver may be utilized to determine whether the candidate holds within the bounded number of cycles. The CNF formula may correspond to: $I \wedge \bigcap_{i=1\ldots k} TR_i$. Assuming that a state may be described using a set of Boolean variables, the CNF formula may utilize k replicas of the set to describe the state at each cycle. Thus, the transition relation defines transition relation axioms of how the state in cycle i+1 is defined based on the state in cycle i and optionally based on given inputs in cycle i. Set of inputs may also be replicated for each cycle. It will be noted that a transition relation may be a function defined: $TR_i$: $\{in_i^1, \ldots, in_i^n, v_i^1, \ldots, v_i^m\} \to \{v_{i+1}^1, \ldots, v_{i|1}^m\}$, where $in_z^w$ is an input signal number w (out of n input signals) in cycle z, where $v_z^w$ is a state variable number w (out of m state variables) in cycle z. However, although each TR function differs in the variables it refers to (e.g., input signals and state variables of current state and state variables of next state), it may define the same relation from each state to the next state, and for simplicity purposes may be referred to as TR. Therefore, the formula may be referred to as $I \wedge TR^k$. In some exemplary embodiments, a clause associated with I may be referred to as an initial axiom. Additionally or alternatively, a clauses associated with the TR may be referred to as a transition relation axiom.

In steps 120, 130, 140, a CNF formula may be determined The CNF may comprise of clauses added in each of steps 120, 130, 140 or a portion thereof.

In step 120, a first auxiliary variable may be defined with respect to substantially each candidate. The first auxiliary variable may be a Boolean variable. The first auxiliary variable may be indicative of whether a shifted version of the candidate is held. In some exemplary embodiments, the first auxiliary variable may be defined using the relation: $C'_i \to y_i$. In some exemplary embodiments, CNF clauses may be introduced to define the relationship. For each literal $a'_i$ of $C'_i$ a binary clause $(\neg a'_i, y_i)$ may be introduced to a CNF.

In step 130, a second auxiliary variable may be defined with respect to substantially each candidate. The second auxiliary variable may be a Boolean variable. The second auxiliary variable may be useful for implying the candidate is held in a first cycle. In some exemplary embodiments, the second auxiliary variable may be defined using the relations: $x_i \to C_i$. In some exemplary embodiments, CNF clauses may be introduced to define the relationship. For each literal $a_i$ of $C_i$ a binary clause $(\neg x_i, a_i)$ may be introduced to a CNF.

In step 140, an inductive step for a set of candidates (S) may be determined The inductive step may be useful for proving that if the set S is held in a first cycle, each candidate is also held with respect to a next cycle. In some exemplary embodiments, an inductive step formula may be defined, such as of the form:

$$\bigcap_i x_i \wedge TR^k \to \bigcup_i \neg y_i.$$

In some exemplary embodiments, portions of the formula may be provided using CNF and portions may be provided using an assumptions functionality of a SAT solver, as is further disclosed hereinbelow. In some exemplary embodiments, the CNF may comprise clauses introduced in steps 120 and/or 130. Additionally or alternatively, the CNF may comprise clauses associated with the transition relation axiom with respect to one or more cycle.

In some exemplary embodiments, an invariant candidate may be a combinatorial invariant candidate. A combinatorial invariant candidate refers to literals of variables associated with the same cycle (e.g., the clause $(x_{10} \vee \neg y_{10} \vee z_{10} \vee \neg w_{10})$. For combinatorial invariant candidates referring to cycle i, $TR_i \wedge S \to \neg S'$ may be examined. In case S comprises combinatorial invariant candidates associated with different cycles, TRs of the different cycles may be introduced to the formula.

In some exemplary embodiments, an invariant candidate may be a temporal invariant candidate. A temporal invariant candidate describes a relationship between variables of different cycle (e.g., $(x_4 \vee \neg y_7 \vee \neg z_5)$). For temporal invariant candidates TRs of the cycles in between the lowest and highest cycle may be introduced (e.g., with respect to the example above, the formula may be: $TR_4 \wedge TR_5 \wedge TR_6 \wedge TR_7 \wedge S \to \neg S'$). It will be understood that S' refers to the invariant candidates shifted by one cycle. For example, with respect to the abovementioned temporal invariant candidate, the shifted candidate may be $(x_5 \vee \neg y_8 \vee z_6)$. In case S comprises temporal invariant candidates associated with different cycles, TRs of the different cycles may be introduced.

In some exemplary embodiments, some candidates are temporal invariant candidates and some are combinatorial temporal invariants. The TRs of all relevant cycles may be introduced to the formula. In some exemplary embodiments, if the highest cycle being referred to is j, the formula may be: $TR^j \wedge S \to \neg S'$.

It will be noted, that although $TR \wedge S \to \neg S'$ may be unsatisfiable, individual examination of each candidate $C \in S$ may yield that $TR \wedge C \to \neg C'$ is satisfiable (for example, in case that the proof of the invariant C is based on another invariant). Thus, choosing a set of candidates to be checked together may be useful in proving more invariants.

In step 160, the formula of the inductive step may be solved. In some exemplary embodiments, a SAT solver may be utilized to prove or refute the inductive step. The SAT solver may be an apparatus, implemented in hardware, software, firmware, combination thereof, or the like, operative to determine a satisfying assignment of a Boolean satisfiability problem, or, alternatively, indicate that no such satisfying assignment exists. In some exemplary embodiments, the SAT solver may be, as a non-limiting example, Chaff, disclosed in Matthew W. Moskewicz, et al, "Chaff: engineering an efficient SAT solver", Proceedings of the 38th conference on Design automation, p. 530-535, 2001, which is hereby incorporated by reference, MiniSat, disclosed in Niklas Een et al, "An Extensible SAT-solver", SAT 2003, which is hereby incorporated by reference, or the like. In some exemplary embodiments, a SAT solver may implement the Davis-Putnam-Logemann-Loveland algorithm (DPLL) algorithm, or the like.

A SAT solver that supports assumptions, such as, for example, MiniSat, may be adapted to choose values in accordance with unit clauses before a process of solving the SAT problem commences. In some exemplary embodiments, deductions by the SAT solver are independent of such solutions, and therefore all deductions (e.g., conflict clauses, resolution clauses, or the like) are correct even in case the assumption would not have been taken. A SAT solver that supports the assumption mechanism may be utilized. As in each iteration (of steps 140-185, as is disclosed hereinbelow) a different set of candidates is checked, it may be desirable to reuse deductions not associated with the candidates being checked. In some exemplary embodiments, the relationships of the first and second auxiliary variables may be introduced to the CNF, as well as the transition relation axioms. However, which candidate is held in the first cycle and which candidate is not held in the predetermined cycle may be defined using assumptions. For example, the assumptions may be the following: for each candidate in S, the unit clause $(x_i)$ may be assumed and the clause $$\left(\bigcup_i \neg y_i\right)$$

may also be assumed. Thus, when the set of candidates in S changes, the CNF remains unchanged, and only the assumptions change.

In some exemplary embodiments, an auxiliary variable aux may be introduced and utilized in order for a non-unit-clause assumption, denoted assume, to be used. A non-unit clause (aux ∨ assume) may be added to the CNF, and the unit clause (¬aux) may be assumed, thereby implying (assume) in the CNF. In some exemplary embodiments, the assumption mechanism may only support unit clause assumptions.

In some exemplary embodiments, step 160 may be performed using a tool different than a SAT solver, such as a Constraint Satisfaction Problem (CSP) solver, a theorem prover, or the like.

In step 170, a determination whether a satisfying assignment to the inductive step formula was found. If so, then there exists at least one candidate which is refuted by the assignment and step 180 may be performed. Otherwise, in all scenarios, the subset of candidate S is proven inductively, and step 190 may be performed. In some exemplary embodiments, the subset of candidate is proven to be invariants after one or more cycles in the model (e.g., after an "initial stage" within the model) in accordance with the bound of step 110.

In step 180, it may be determined which candidate was refuted. Utilizing the first auxiliary variables may be useful for efficiently identifying refuted candidates by checking the Boolean values of the first auxiliary variables. it will be noted that as there is an implication relationship between the value of the candidates and the first auxiliary variables, there may be candidates which are not held, and still the value of their respective first auxiliary variables may not indicate this. In some exemplary embodiments, the values of the candidates themselves may be evaluated. In some exemplary embodiments, after determining which candidates are refuted based on the first auxiliary variables, values of non-refuted candidates may be checked to determine if they too are refuted.

In step 185, each refuted candidate is removed from the set of candidates (S). Steps 140-170 may be performed with respect to the reduced subset S. In some exemplary embodiments, in case all candidates are removed and S is an empty set, the method may end and indicate all candidates are refuted.

In step 190, in case the inductive step formula is unsatisfiable, all candidates in S may be deemed as proven to be invariants. Optionally, the invariants begin to hold after the initial stage. In some exemplary embodiments, an output may be provided indicating the invariants so that a user may utilize the invariants. Optionally, the invariants may be added to the model and utilized, in step 195, for model checking properties with respect to the model.

In some exemplary embodiments, a property, such as a safety property, may be checked by introducing the property as a candidate in step 100. In case the property is deemed an invariant that holds from the initial step of the model, the model may be said to hold the property.

In some exemplary embodiments, the property may be proven inductively using the invariants and transition relation. The inductive proof may be established by proving that if the property is held in a first cycle, then it will be held in the next cycle as well. For example, a SAT solver may be given a CNF associated with the following formula: $TR \wedge INVARs \wedge p \rightarrow \neg p'$, where INVARs are the invariants, p is the property and p' is characterization of the property for the next state. A determination that there is no satisfying assignment may indicate that the property is always held. In some exemplary embodiments, the inductive proof may be associated with several cycles and not a single cycle, such as by including TR of the several cycles.

Figure 2:
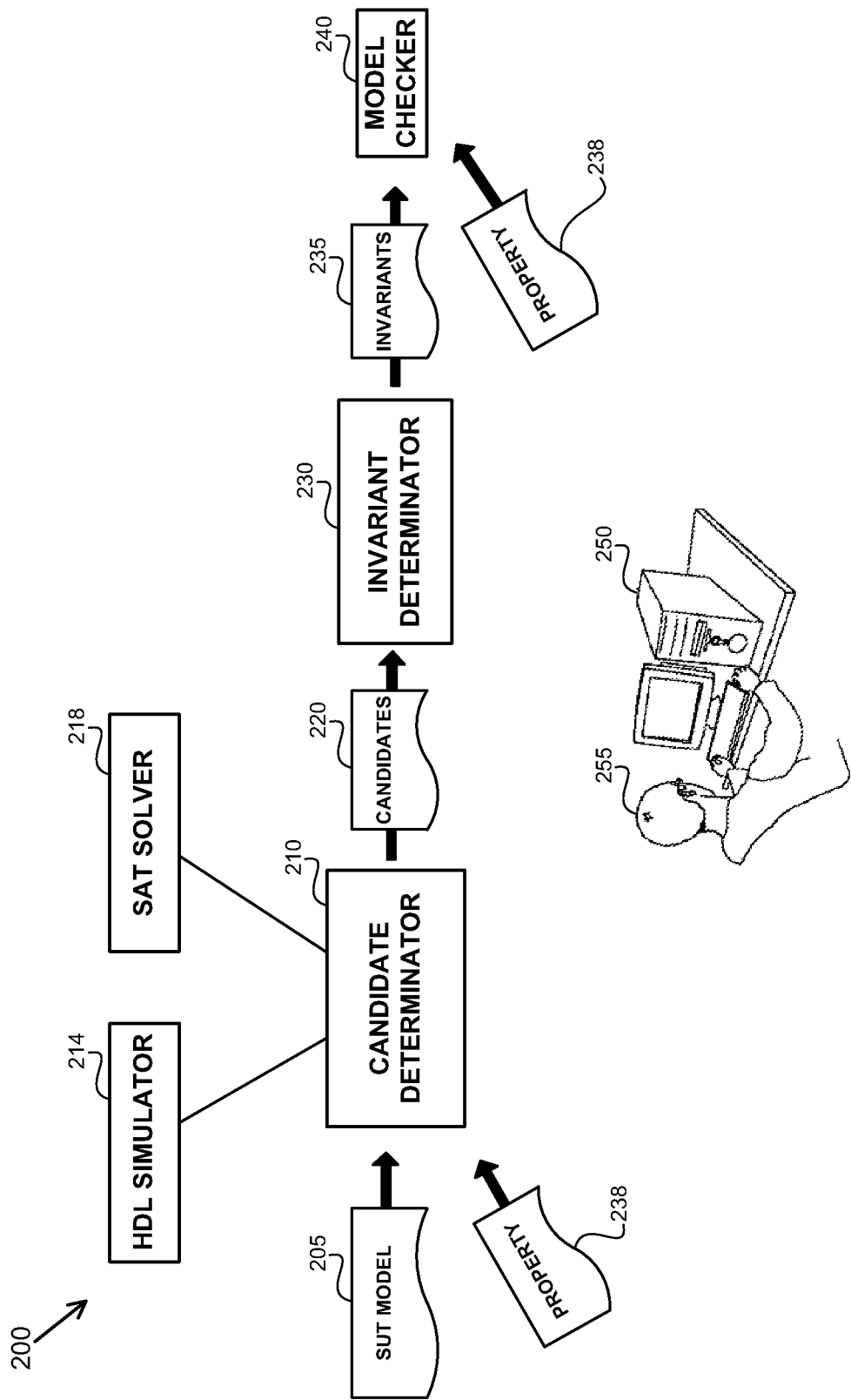
FIG. 2 shows a diagram of a computerized environment, in accordance with some exemplary embodiments of the disclosed subject matter.

Referring now to FIG. 2 showing a diagram of a computerized environment 200, in accordance with some exemplary embodiments of the disclosed subject matter.

A model 205 of a System Under Test (SUT) may be provided to the computerized environment, such as prepared by a verification engineer, a specification designer, or the like. The model may comprise initial axiom and/or transition relation axiom. The model may define variables useful for indicating a state of the SUT in a given cycle. The transition relation axiom may be useful to describe a next state of the SUT based on a current state and/or input signals.

A candidate determinator 210 may determine a set of candidates 220 for the SUT model 205. In some exemplary embodiments, the candidate determinator 210 may property-driven. Optionally, the candidate determinator 210 may obtain the property 238 and based thereon determine the candidates. In some exemplary embodiments, the candidate determinator 210 may utilize a SAT solver 218 to determine the candidates, such as based on clauses of a proof of unsatisfiability, a proof of the property, or the like. Additionally or alternatively, the candidate determinator 210 may utilize a simulator, such as an HDL simulator 214, to simulate executions of the SUT model 205. Based on the simulated executions, candidate invariants may be determined An invariant determinator 230 may determine a set of invariants 235 based on the candidates 220. In some exemplary embodiments, the invariant determinator 230 may utilize perform a method such as disclosed in FIG. 1.

A model checker 240, such as a symbolic model checker, an explicit model checker, or the like may be utilized to check if the model 205 holds the property 238. In some exemplary embodiments, the model checker 240 may be a Binary Decision Diagram (BDD)-based model checker, a SAT-based model checker or the like. In some exemplary embodiments, the invariants 235 may be added to the model 205 and the property 238 may be checked with respect to the modified model. Additionally or alternatively, the model checker 240 may be configured to check a safety property with respect to the model 205 by checking that the initial state holds the property and that the property itself is an invariant. The invariants may be utilized in other manners as well.

A user 255 may utilize a Man-Machine Interface (MMI) 250 to interact with the computerized environment 200. The computerized environment 200 may comprise of one or more computerized devices functioning as the different components thereof. The user 255 may utilize the MMI 250 to provide input, such as the SUT model 205, the property 238, commands, and preferences to the computerized environment 200 or any component thereof. In some exemplary embodiments, the user 255 may provide candidates 220 in addition to, or instead of, candidates provided by the candidate determinator 210. The user 255 may use the MMI 250 to review output and receive notifications by the computerized environment 200.

Figure 3:
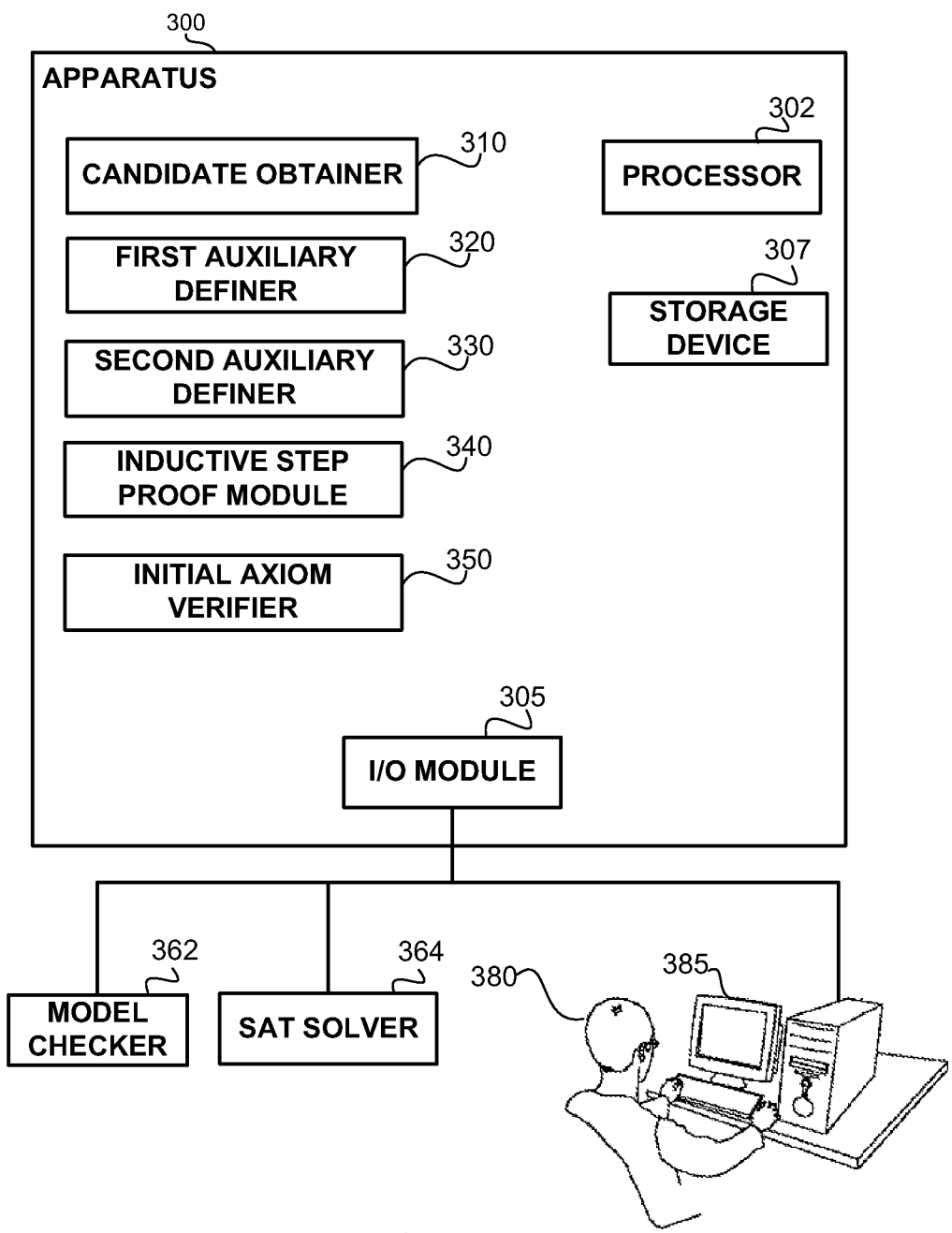
FIG. 3 shows a block diagram of components of an apparatus useful for determining invariants based on candidates, in accordance with some exemplary embodiments of the disclosed subject matter.

Referring now to FIG. 3 showing a block diagram of components of an apparatus for determining invariants based on candidates, in accordance with some exemplary embodiments of the disclosed subject matter. An apparatus 300 may be a computerized apparatus adapted to perform a method such as depicted in FIG. 1.

In some exemplary embodiments, apparatus 300 may comprise a processor 302. The processor 302 may be a Central Processing Unit (CPU), a microprocessor, an electronic circuit, an Integrated Circuit (IC) or the like. Alternatively, the apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). The processor 302 may be utilized to perform computations required by the apparatus 300 or any of it subcomponents.

In some exemplary embodiments of the disclosed subject matter, the apparatus 300 may comprise an Input/Output (I/O) device 305 such as a terminal, a display, a keyboard, an input device or the like to interact with the system, to invoke the system and to receive results. It will however be appreciated that the system can operate without human operation.

In some exemplary embodiments, the I/O module 305 may be utilized to provide an interface to a user 380, such as 255, which may utilize an MMI 385, such as 250, to interact with the apparatus 300, such as by reviewing results, logs and the like, providing commands, rules, preferences, formulas or the like, or interacting in any similar manner Additionally or alternatively, the I/O module 305 may be utilized to interface to a SAT solver 364. The SAT solver 364 may be a third-party SAT solver used as a black-box, an off-the-shelf SAT solver, a specialized SAT solver, or the like.

Additionally or alternatively, the I/O module 305 may be utilized to interface to a model checker 362. The model checker 362 may be a third-party model checker, an off-the-shelf model checker, a specialized model checker, or the like. The model checker 362 may be configured to model check an unbounded version of the model using the invariants determined by the apparatus 300.

In some exemplary embodiments, apparatus 300 may comprise one or more storage devices such as storage device 307. The storage device 307 may be persistent or volatile. For example, the storage device 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, the storage device 307 may retain program code operative to cause the processor 302 to perform acts associated with any of the steps shown in FIG. 1 above.

The components detailed below may be implemented as one or more sets of interrelated computer instructions, executed for example by the processor 302 or by another processor. The components may be arranged as one or more executable files, dynamic libraries, static libraries, methods, functions, services, or the like, programmed in any programming language and under any computing environment.

A candidate obtainer 310 may be configured to obtain a set of candidates of invariants with respect to a model. In some exemplary embodiments, the candidate obtainer 310 may be configured to determine the candidates itself or obtain them for an external source.

A first auxiliary definer 320 may be configured to define a first auxiliary variable with respect to substantially each candidate. The first auxiliary definer 320 may be operative to perform step 120 of FIG. 1.

A second auxiliary definer 330 may be configured to define a second auxiliary variable with respect to substantially each candidate. The second auxiliary definer 330 may be operative to perform step 130 of FIG. 1

An inductive step proof module 340 may be configured to prove the inductive step of an inductive proof. The inductive step comprises proving that if the candidates are held in a first cycle, they are also held in a predetermined cycle succeeding the first cycle, such as its immediate next cycle. The inductive step proof module 340 may be configured to perform steps 140-150 of FIG. 1. The inductive step proof module 340 may utilize the SAT solver 264 for proving the inductive step formula. In some exemplary embodiments, the inductive step proof module 340 may be configured to iteratively refute candidates and remove them from the set of candidates until a subset of the candidates is proven to comprise only invariants.

An initial axiom verifier 350 may be configured to determine whether the candidates are held within a bounded number of cycles from an initial state of the model. Additionally or alternatively, the initial axiom verifier 350 may be configured to determine whether a candidate is held from the initial state itself, such as useful in proving a safety property, in accordance with the disclosed subject matter.

The flowchart and block diagrams in the figures illustrate the architecture, functionality, and operation of possible implementations of systems, methods and computer program products according to various embodiments of the present disclosure. In this regard, each block in the flowchart and some of the blocks in the block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, any non-transitory computer-readable medium, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method performed by a computerized device, comprising:
    obtaining a set of candidates of invariants with respect to a model, the model comprising a transition relation axiom and an initial axiom, wherein states of the model are represented by values of variables, wherein the transition relation axiom and the initial axiom are defined over the variables, wherein the transition relation axiom defines values of the variables in a cycle based on values of the variables in a previous cycle, wherein the initial axiom defines values of the variables at an initial cycle;
    for each candidate, adding to the model a first auxiliary variable, thereby increasing the number of bits used to represent each state of the model, and modifying the transition relation axiom to define a value of the first auxiliary variable as being implied from the candidate being held in a predetermined cycle, wherein said adding is performed by a computer; and
    iteratively trying to prove an inductive step with respect to a subset of the candidates, wherein in response to determining that a candidate is not held inductively removing the candidate from the subset of the candidates, wherein determining that the candidate is not held inductively is performed based on values of the first auxiliary variables, wherein said iteratively trying to prove is performed by the computer.

2. The computer-implemented method of claim 1 further comprises utilizing the initial axiom to determine a set of candidates that are held within a bounded number of cycles from an initial step of the model, wherein said iteratively trying to prove is performed with respect to the set of candidates held within a bounded number of cycles from the initial step.

3. The computer-implemented method of claim 1, wherein said iteratively trying to prove an inductive step comprises:
    defining an inductive step formula;
    utilizing a Boolean satisfiability problem solver to determine a satisfying assignment to the inductive step formula; and
    in response to a satisfying assignment, determining one or more candidates not held based on values of the first auxiliary variables in the satisfying assignment.

4. The computer-implemented method of claim 3, wherein the inductive step formula corresponds to:

$$\bigcap_i C_i \wedge TR \to \bigcup_i \neg aux_i,$$

wherein $C_i$ is an i-th candidate, wherein TR is one or more transition relation axiom between the first cycle and the predetermined cycle, wherein $aux_i$ is the first auxiliary variable associated with the i-th candidate, and wherein $\neg aux_i$ is indicative that the i-th candidate is not held in the predetermined cycle.

5. The computer-implemented method of claim 1 further comprising:
    for substantially each candidate, adding to the model a second auxiliary variable, the second auxiliary variable is defined to imply that the candidate is held in a first cycle, wherein the first cycle precedes the predetermined cycle; and wherein said iteratively trying to prove an inductive step comprises utilizing the second auxiliary variables to imply that candidates of the subset of candidates are held in the first cycle.

6. The computer-implemented method of claim 5, wherein said iteratively trying to prove an inductive step comprises:
defining an inductive step formula; and
utilizing a Boolean satisfiability problem solver to determine a satisfying assignment to the inductive step formula, wherein said utilizing comprises providing to the Boolean satisfiability problem solver a list of assumptions comprising unit clauses associated with the second auxiliary variables.

7. The computer-implemented method of claim 6, wherein the inductive step formula corresponds to:

$$TR \to \bigcup_i \neg aux_i^1,$$

wherein TR is one or more transition relation axiom between the first cycle and the predetermined cycle, wherein $aux_i^1$ is the first auxiliary variable associated with an i-th candidate, wherein $\neg aux_i^1$ is indicative that the i-th candidate is not held in the predetermined cycle; and wherein the unit clauses are $(aux_i^2)$, wherein $aux_i^2$ is the second auxiliary variable associated with the i-th candidate.

8. The computer-implemented method of claim 5, wherein the second auxiliary variable is defined: $aux_i^1 \to C_i$, wherein $aux_i^2$ is the second auxiliary variable associated with the i-th candidate, and wherein $C_i$ is the i-th candidate in the first cycle.

9. The computer-implemented method of claim 1, wherein the first auxiliary variable is defined: $C'_i \to$, $aux_i$ is the first auxiliary variable associated with the i-th candidate, and wherein $C'_i$ is the i-th candidate in the predetermined cycle.

10. The computer-implemented method of claim 1, wherein at least one of the candidates is a non-unit clause, correlating with values of more than a single Boolean variable.

11. The computer-implemented method of claim 1, wherein said obtaining the set of candidates of invariants comprises obtaining the set of candidates from a proof generated by a Boolean satisfiability problem solver with respect to a bounded version of the model.

12. The computer-implemented method of claim 1, wherein said obtaining the set of candidates of invariants comprises performing simulated executions of the model and determining potential invariants based on the simulated executions.

13. The computer-implemented method of claim 1 further comprising:
obtaining a property to be checked on the model, adding the property as a candidate to the set of candidates; and in response to determining that the property is an invariant, indicating that the property is held by the model.

14. The computer-implemented method of claim 1, wherein said obtaining the set of candidates of invariants comprises obtaining a set of property-driven candidates, wherein the property-driven candidates are with respect to a property to be checked with respect to the model.

15. An apparatus, the apparatus comprising:
a processing unit;
a candidates obtainer operative to obtain a set of candidates of invariants with respect to a model, the model comprising a transition relation axiom and an initial axiom, wherein states of the model are represented by values of variables, wherein the transition relation axiom and the initial axiom are defined over the variables, wherein the transition relation axiom defines values of the variables in a cycle based on values of the variables in a previous cycle, wherein the initial axiom defines values of the variables at an initial cycle;
a first auxiliary definer operative, with respect to each candidate, to add to the model a first auxiliary variable, thereby increasing the number of bits used to represent each state of the model, and modifying the transition relation axiom to define a value of the first auxiliary variable as being implied from the candidate being held in a predetermined cycle; and
an inductive step proof module operative to utilize said processing unit to prove inductively that if a subset of the candidates is held in a first cycle the subset is held in the predetermined cycle, wherein the first cycle precedes the predetermined cycle, wherein said inductive step proof module is operative to determine whether the candidates of the subset are held in the predetermined cycle using values of the first auxiliary variables.

16. The apparatus of claim 15 operatively coupled to a model checker, wherein the model checker is operative to check whether a property is held by a modified model, wherein the modified model comprises the model and candidates proven as invariants by said inductive step proof module.

17. The apparatus of claim 16, wherein said inductive step proof module is operatively coupled to a Boolean satisfiability problem solver operative to determine a satisfying assignment to a Boolean satisfiability problem or indicate the Boolean satisfiability problem being unsatisfiable.

18. The apparatus of claim 16, further comprises:
an initial axiom verifier operative to determine whether the candidates are held within a bounded number of cycles from an initial state of the model.

19. The apparatus of claim 16, further comprises:
a second auxiliary definer operative, with respect to substantially each candidate, to add to the model a second auxiliary variable, the second auxiliary variable is defined to imply the candidate being held in a first cycle, wherein the first cycle precedes the predetermined cycle; and
wherein said inductive step proof module is configured to utilize the second auxiliary variables to indicate that the subset is held in the first cycle.

20. The apparatus of claim 19, wherein said inductive step proof module is operatively coupled to a Boolean satisfiability problem solver, wherein the Boolean satisfiability problem solver is configured to obtain a set of one or more assumptions over a Boolean satisfiability problem, wherein said inductive step proof module is configured to provide the Boolean satisfiability problem solver a set of assumptions on the values of the second auxiliary variables, whereby the set of assumptions indicate that the subset is held in the first cycle.

21. A computer program product comprising:
a non-transitory computer readable medium;
a first program instruction for obtaining a set of candidates of invariants with respect to a model, the model comprising a transition relation axiom and an initial axiom, wherein states of the model are represented by values of variables, wherein the transition relation axiom and the initial axiom are defined over the variables, wherein the transition relation axiom defines values of the variables in a cycle based on values of the variables in a previous cycle, wherein the initial axiom defines values of the variables at an initial cycle;

a second program instruction for adding to the model a first auxiliary variable for each candidate, thereby increasing the number of bits used to represent each state of the model, and modifying the transition relation axiom to define a value of the first auxiliary variable as being implied from the candidate being held in a predetermined cycle;

a third program instruction for iteratively trying to prove an inductive step with respect to a subset of the candidates, wherein in response to determining that a candidate is not held inductively removing the candidate from the subset of the candidates, wherein determining that the candidate is not held inductively is performed based on values of the first auxiliary variables; and wherein said first, second, and third program instructions are stored on said non-transitory computer readable medium.

\* \* \* \* \*